(12) United States Patent
Dedic et al.

(10) Patent No.: US 12,470,203 B1
(45) Date of Patent: Nov. 11, 2025

(54) HIGH SPEED PHASE DETECTOR

(71) Applicant: Cisco Technology, Inc., San Jose, CA (US)

(72) Inventors: Ian Dedic, Maynard, MA (US); Darren Walker, Maynard, MA (US); Vineet Mishra, Maynard, MA (US)

(73) Assignee: Cisco Technology, Inc., San Jose, CA (US)

( * ) Notice: Subject to any disclaimer, the term of this patent is extended or adjusted under 35 U.S.C. 154(b) by 17 days.

(21) Appl. No.: 18/611,206

(22) Filed: Mar. 20, 2024

Related U.S. Application Data

(60) Provisional application No. 63/453,441, filed on Mar. 20, 2023.

(51) Int. Cl.
*H03K 3/012* (2006.01)
*H03K 3/0233* (2006.01)
*H03L 7/087* (2006.01)

(52) U.S. Cl.
CPC .......... *H03K 3/012* (2013.01); *H03K 3/0233* (2013.01); *H03L 7/087* (2013.01)

(58) Field of Classification Search
CPC ...... H03B 5/12; H03B 5/1206; H03B 5/1212; H03B 5/1215; H03B 5/1218; H03L 7/093; H03L 7/095; H03L 7/085; H03L 7/0805; H03L 7/08
See application file for complete search history.

(56) References Cited

U.S. PATENT DOCUMENTS 8,664,923 B2 * 3/2014 De Cremoux .......... H02M 1/14
                                                    323/223
8,970,192 B2 * 3/2015 De Cremoux ............ G05F 1/10
                                                    323/282

\* cited by examiner

*Primary Examiner* — Diana J. Cheng
(74) *Attorney, Agent, or Firm* — Patterson + Sheridan, LLP

(57) ABSTRACT

In one embodiment, the disclosure relates to a phase detector. The phase detector may include a first inductor having an inductance $L_1$; a second inductor having an inductance $L_2$; and a frequency mixer having a parasitic capacitance $C_{Tail}$, the frequency mixer comprising, a common node tail; a first clock signal generator configured to output a first clock signal having a first frequency, a second clock signal generator configured to output a second clock signal having a second frequency, the first clock signal generator and the second clock signal generator in electrical communication with the common node tail, a first resistor in electrical communication with the first clock signal generator, a second resistor in electrical communication with the second clock signal generator, and an output channel configured to transmit a DC voltage signal ($V_{phase}$) that corresponds to the phase relationship between the first clock signal and the second clock signal.

20 Claims, 2 Drawing Sheets ated by CLK2 and CLK 4 shown in FIG. 1A. In some
HIGH SPEED PHASE DETECTOR

CROSS REFERENCE TO RELATED APPLICATIONS

This application claims priority to and the benefit of U.S. Provisional Patent Application No. 63/453,441 filed Mar. 20, 2023, the disclosure of which is herein incorporated by reference in its entirety.

FIELD

This disclosure relates generally to the fields of clock regulation and digital to analog conversion in integrated circuits.

BACKGROUND

Contemporary integrated circuits make extensive use of digital to analog converter circuits that are advantageously mass-produced in various configurations for various purposes.

These and other features of the applicant's teachings are set forth herein.

BRIEF DESCRIPTION OF THE FIGURES

Unless specified otherwise, the accompanying drawings illustrate aspects of the innovations described herein. Referring to the drawings, wherein like numerals refer to like parts throughout the several views and this specification, several embodiments of presently disclosed principles are illustrated by way of example, and not by way of limitation. The drawings are not intended to be to scale. A more complete understanding of the disclosure may be realized by reference to the accompanying drawings in which.

OVERVIEW

In part, in one aspect, the disclosure relates to a system that includes a phase detector. The phase detector may include a first inductor having an inductance $L_1$; a second inductor having an inductance $L_2$; and a frequency mixer having a parasitic capacitance $C_{Tail}$, the frequency mixer comprising, a common node tail; a first clock signal generator configured to output a first clock signal having a first frequency, a second clock signal generator configured to output a second clock signal having a second frequency, the first clock signal generator and the second clock signal generator in electrical communication with the common node tail, a first resistor in electrical communication with the first clock signal generator, a second resistor in electrical communication with the second clock signal generator, and an output channel configured to transmit a DC voltage signal ($V_{phase}$) that corresponds to the phase relationship between the first clock signal and the second clock signal.

EXEMPLARY EMBODIMENTS

High-performance, current-steering analog to digital converters (ADCs) or digital to analog converters (DACs) operating at tens of gigasamples per second may rely on phase detector circuits to eliminate timing differences between clock paths and so to prevent timing errors. At sampling rates of tens of gigasamples per second, timing closure at the high frequency ends of a DAC stage and an ADC stage becomes increasingly difficult as timing margins reduce. At high sampling rates, device performance also becomes especially sensitive to timing differences due to process and temperature variation.

In some embodiments, high speed DACs and ADCs may use multiplexing and demultiplexing schemes to allow lower frequency sampling of sub-stages, i.e. a 2:1 multiplexer allows two DACs, such as a first subDAC and a second subDAC, to operate at half the usual clock rate. In many embodiments, various phase detectors are disclosed herein such as phase detector circuits that will detect phase errors between high frequency clocks that differ in frequency by a factor of two. In some embodiments, the phase detector circuits include one or more inductors, one or more transistors, one or more metal-oxide-semiconductor (MOS) devices, one or more current sources, a mixer, other circuit elements, and combinations of the foregoing. In various embodiments, the phase detector maintains a constant delay for use by a phase interpolator.

Figure 1B:
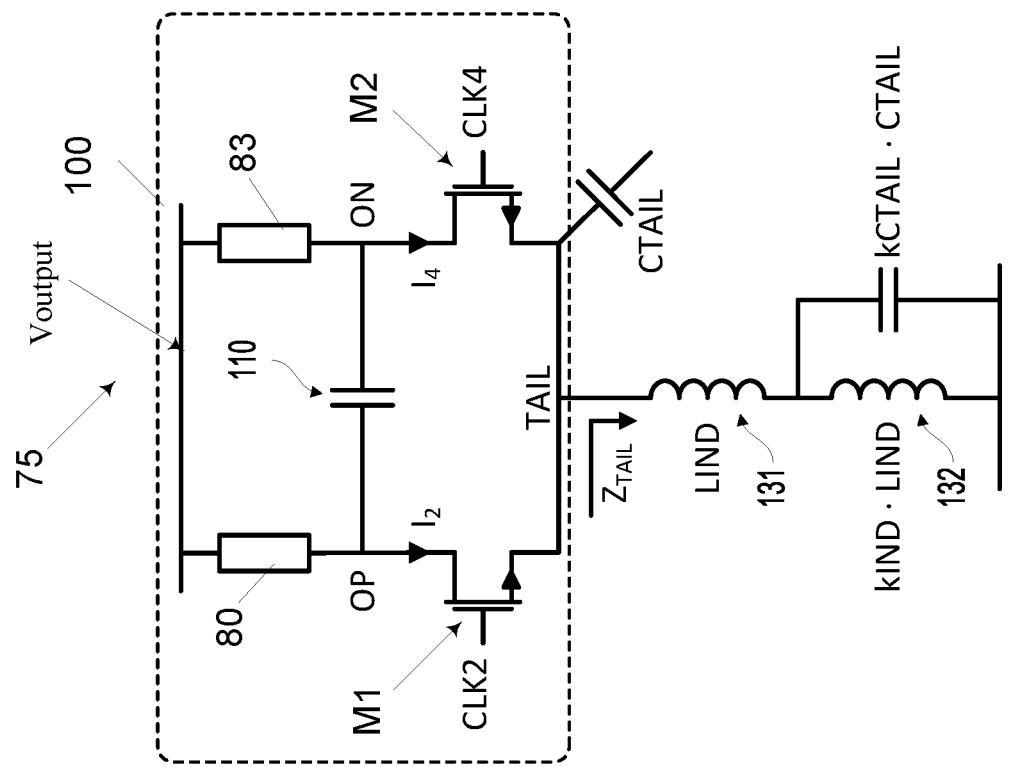
FIG. 1B is a schematic diagram of a phase detector circuit with an inductor-based current source according to an exemplary embodiment of the disclosure.
Figure 1A:
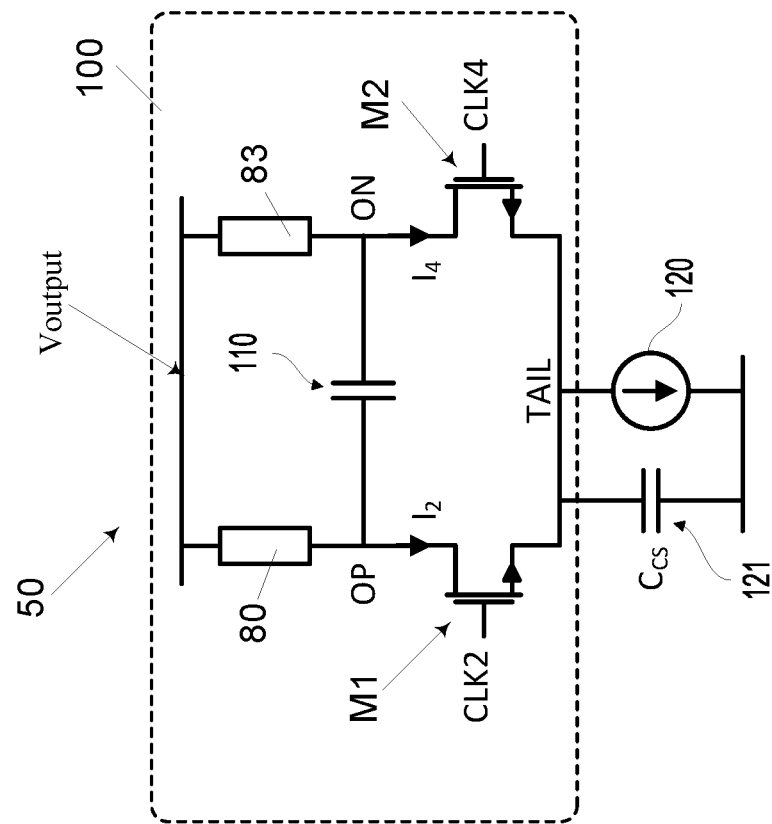
FIG. 1A is a schematic diagram of a phase detector circuit with a MOS current source according to an exemplary embodiment of the disclosure.

Refer now to the exemplary embodiment of FIG. 1A, illustrating a phase comparator circuit/phase detector 50. An alternative embodiment of a phase comparator/phase detector 75 is also shown in FIG. 1B that includes some of the same elements discussed below with regard to FIG. 1B.

As shone in FIG. 1A, the phase detector 50 includes a frequency mixer 100 acts on two clocks CLK2 and CLK4 operating at a first frequency and a second frequency. In some embodiments, the first and second frequencies may be about 80 GHz and about 40 GHz, respectively. In various embodiments, the frequency mixer receives a first signal with a first frequency F1 and a second signal with a second frequency F2 and outputs one or more signals having mixed frequencies of F1+F2 and/or F1−F2. In some embodiments, the signals are clock signals such as the signals that may be generated by CLK2 and CLK 4 shown in FIG. 1A. In some embodiments, the frequency mixer 100 also includes a first resistor 80 and a second resistor 83. In many embodiments, the first resistor and the second resistor may be variable resistors that can be adjusted such that varying their respective resistance value changes the output voltage $V_{phase}$ at $V_{output}$ that corresponds to the phase relationship between the signals from CLK2 and CLK4.

In some embodiments, a differential pair is formed by two matched transistors M1, M2, one with a gate connected to CLK2 and the other with a gate connected to CLK4. In various embodiments, transistors M1, M2 are MOS transistors. Transistors M1, M2 may serve as clock signal switching devices in some embodiments. Current $I_2$ is shown flowing into M1 of the left and current $I_4$ is shown flowing into M2 on the right. OP and ON correspond to the positive and negative input power nodes that are connected by bridge capacitor 110. In some embodiments, the drain of each of M1, M2 connect to OP and ON as shown. In some embodiments, the source of M1, M2 connected to a tail node.

With a tail current source 120, i.e. a current source having infinite impedance, the differential output OP−ON is the mixed output from the two clocks CLK2, CLK4. A Fourier transform of the differential output OP−ON will have significant power in frequency components at $f_{CLK2}$ and $f_{CLK4}$ as well as in inter-modulation components, including $f_{CLK2}-2f_{CLK4}$. If $f_{CLK2}=2f_{CLK4}$, then this inter-modulation frequency component appears at DC and its amplitude is proportional to the phase relationship between CLK2 and CLK4. In some embodiments, a bridge capacitor 110 between OP and ON filters out all higher frequency components, such the DC component remains after the filtering. In, the DC value of OP−ON then provides a measure of the phase relationship between CLK2 and CLK4 in some embodiments. In some embodiments, a DC voltage that corresponds to a phase relationship between the frequency of CLK2 and the frequency of CLK4 that is generated at output Voutput. Voutput is dependent on the phase relationship of CLK2 and CLK4 and may be used to control when a signal is received by a first or odd subDAC and a second or even subDac in an alternating or interleaved manner.

At high frequencies, parasitic capacitances may severely limit performance of phase detector 50. In many embodiments, if the tail current source 120 is implemented with a MOS transistor, a significant parasitic capacitance Ccs 121 will be present at the tail node. This parasitic capacitance lowers the impedance at the tail node, especially at high frequencies. The tail node voltage may include a ripple at both $f_{CLK4}$ and $f_{CLK2}$. As a result, current at these frequencies ($f_{CLK4}$ and $f_{CLK2}$) may be lost, effectively removed by the parasitic capacitance Ccs 121 and thus not appear at the output. The loss of current at frequencies $f_{CLK4}$ and $f_{CLK2}$ may significantly degrading the performance of the phase detector circuit 50. For example, the loss/degradation of certain currents such as those having $f_{CLK4}$ and $f_{CLK2}$ may be significant at clock rates in the tens of gigahertz for CLK2 and CLK4. In various embodiments, the frequencies of CLK2 and CLK4 may range from about 10 GHz to about 500 GHz.

Refer now to the exemplary embodiment of FIG. 1B that shows a phase detector 75. In various embodiments, at the tail of phase detector there is an undesirable capacitance $C_{TAIL}$ as shown that may be reduced, modified, or removed in various embodiments as discussed herein. In many embodiments, by replacing an MOS based current source with two series inductors, such as a first inductor 131 tuned to $f_{CLK2}$ and second inductor 132 tuned to $f_{CLK4}$ or vice versa. The inductance of inductor 131 is $L_{IND}$ in various embodiments. The inductance of inductor 132 is a multiple of $L_{IND}$ with the multiplier being $k_{IND}$ in various embodiments.

In various embodiments, the inductors 131, 132 may be tuned to the frequency values of different clocks by adjusting $k_{IND}$ and $kC_{TAIL}$, which are proportionality values. In some embodiments, the $k_{IND}$ and $kC_{TAIL}$, may be set by sweeping their value to give the highest impedance (or another set threshold value) at FCLK2 and FCLK4 (i.e FIG. 2). In various embodiments, the clock signals are generated by clock generators, clock switches (such as transistor-based switches), or other clock sources. In various embodiments, $L_{IND}$ ranges from about 50 pH to about 3 nH. In many embodiments, $k_{IND}$ ranges from about 0.1 to about 5. In many embodiments, $kC_{TAIL}$ ranges from about 0.1 to about 5. In some embodiments, it is possible to increase the tail node impedance $Z_{TAIL}$ at the two frequencies of interest to produce a high impedance current source at those two frequencies. Tuned properly, the pair of inductors 131, 132 will resonate out or otherwise reduce, remove or modify parasitic capacitance $C_{TAIL}$ already present on the tail node. In some embodiments, the parasitic capacitance $C_{TAIL}$ is any parasitic capacitance not due to any MOS transistor. In some embodiments, $C_{TAIL}$ includes capacitance from the MOS and any metal interconnect forming the tail node. In various embodiments, the inductor-based design that used inductors 131, 132 is configured to tune out the capacitance of the differential MOS switches such as switches M1, M2 and parasitic routing capacitance of node "tail". This further improves the shape of the differential currents by resulting in square wave or substantially square wave differential currents. In some embodiments, the output currents from the phase detector go into load resistors not the output of a current steering. In various embodiments, one or both of the differential currents of the phase detector may be output to a current steering DAC.

Figure 2:
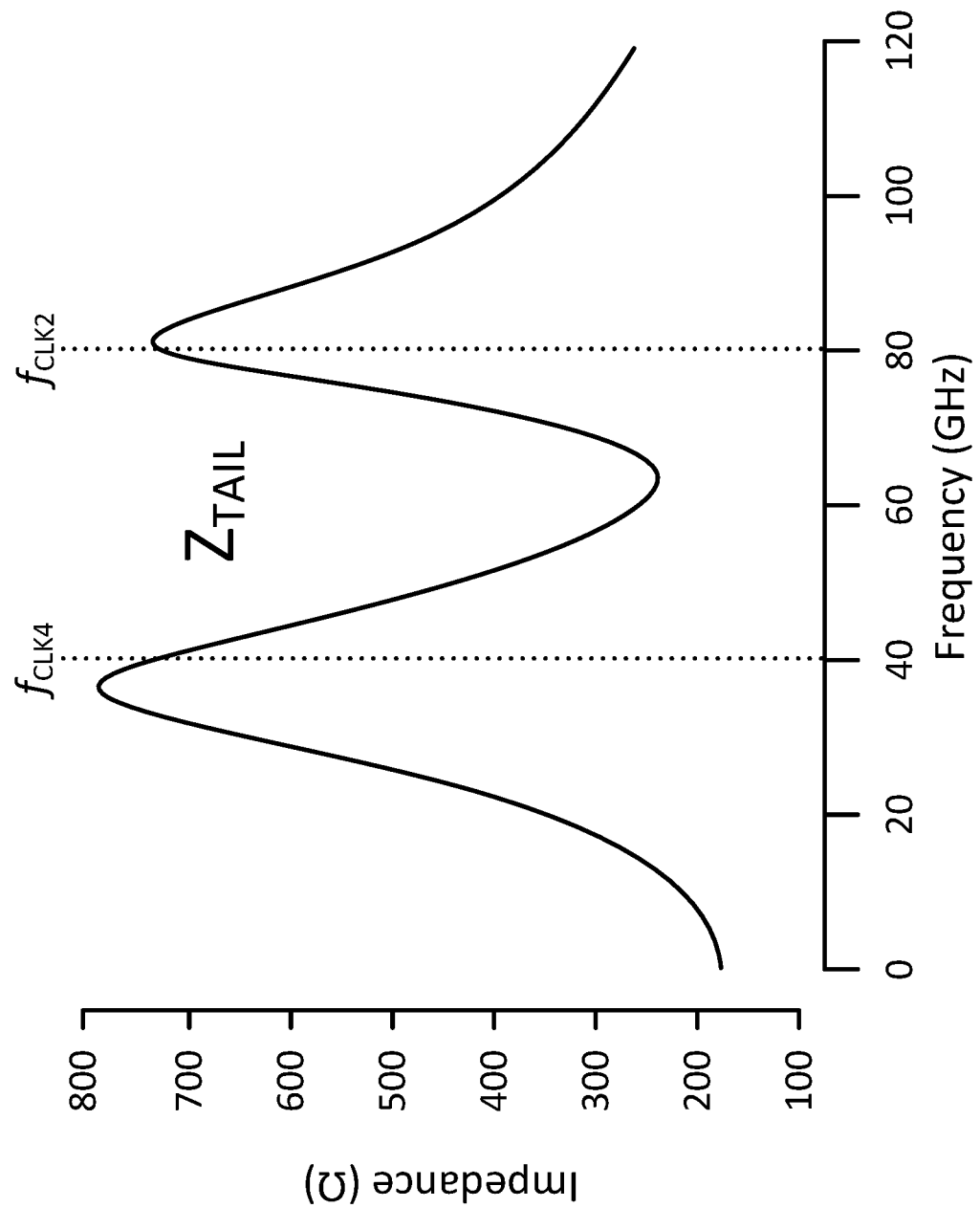
FIG. 2 is a plot of the tail node impedance $Z_{TAIL}$ versus frequency, demonstrating high impedance (an ideal current source) only at the frequencies $f_{CLK4}$ and $f_{CLK2}$, according to an exemplary embodiment of the disclosure.

Refer now to the exemplary embodiment of FIG. 2, wherein a plot of the tail node impedance $Z_{TAIL}$ when the tail current source is implemented as a pair of series inductors as in the exemplary embodiment of FIG. 1B, is shown. The impedance $Z_{TAIL}$ is high at the two clock frequencies $f_{CLK2}$ and $f_{CLK4}$; that is to say, the current source more closely approximates an ideal current source at the two clock frequencies. The high impedance values of the $f_{CLK2}$ and $f_{CLK4}$ signals may result from the removal of or the decrease in $C_{TAIL}$. In some embodiments, $Z_{TAIL}$ ranges from about 300 ohms to about 2000 ohms.

In part, the disclosure relates to various phase detector embodiments that can detect phase errors between high frequency clocks. In many embodiments, the high frequency clocks may differ by a factor of two (or a multiple thereof) in frequency, for example, the frequency of a first clock may be twice the frequency of a second clock (or vice versa).

In part, in one aspect, the disclosure relates to a system that includes a phase detector. The phase detector may include a first inductor having an inductance $L_1$; a second inductor having an inductance $L_2$; and a frequency mixer having a parasitic capacitance $C_{Tail}$, the frequency mixer comprising, a common node tail; a first clock signal generator configured to output a first clock signal having a first frequency, a second clock signal generator configured to output a second clock signal having a second frequency, the first clock signal generator and the second clock signal generator in electrical communication with the common node tail, a first resistor in electrical communication with the first clock signal generator, a second resistor in electrical communication with the second clock signal generator, and an output channel configured to transmit a DC voltage signal ($V_{phase}$) that corresponds to the phase relationship between the first clock signal and the second clock signal.

In some embodiments, the first inductor and the second inductor are in series. In various embodiments, $L_1$ is proportional to $L_2$. In many embodiments, the first clock signal generator is a first MOS transistor and the second clock signal generator is a second MOS transistor, each MOS transistor comprises a source, gate, and drain. In various embodiments, a gate of the first MOS transistor is configured to receive the first clock signal. In various embodiments, the system may further include a positive power delivery node (OP) and a negative power deliver node (ON). In some embodiments, the drain of the first MOS transistor is in electrical communication with the OP and the drain of the second MOS transistor is in electrical communication with the ON. In various embodiments, the system may further include a bridge capacitor in electrical communication with and disposed between OP and ON.

In some embodiments, the second frequency is twice the first frequency. In many embodiments, the first frequency and the second frequency each may range from about 10 GHz to about 500 GHz. In various embodiments, the system may further include a capacitor, the capacitor in parallel with one of the inductors. In various embodiments, the system may further include a first DAC and a second DAC, each DAC in electrical communication with the output channel. In some embodiments, the first DAC and the second DAC are configured to process input data in an interleaved manner that is delayed by a value corresponding to or proportional to $V_{phase}$.

In part, in one aspect, the disclosure relates to a method of reducing parasitic capacitance in a phase detector. The method may include providing a current source to a frequency mixer, wherein the current source comprises a first inductor in electrical communication and in series with a second inductor such that parasitic capacitance is reduced thereby; generating a first clock signal having a first frequency; generating a second clock signal having a second frequency, the first frequency equal to about 0.5 of the second frequency; mixing the first clock signal and the second clock signal using the mixer while the mixer is receiving current from the current source at a tail node; and generating an output signal $V_{phase}$, wherein $V_{phase}$ corresponds to a phase difference between the first clock signal and the second clock signal.

In some embodiments, the method may further include varying a first resistance and a second resistance of the mixer to change $V_{phase}$. In some embodiments, the method may further include selecting an inductance $L_1$ of the first inductor and an inductance $L_2$ of the second inductor such that the first inductor and the second inductor resonate.

In some embodiments, the inductance $L_1$ ranges from about 50 pH to about 3 nH and wherein the inductance $L_2$ is about 0.1 to about 5 times the inductance $L_1$. In some embodiments, t combined impedance comprising the first inductance $L_1$ and the second inductance $L_2$ exhibits a local maximum at the first clock frequency and a local maximum at the second clock frequency.

Although, the disclosure relates to different aspects and embodiments, it is understood that the different aspects and embodiments disclosed herein can be integrated, combined, or used together as a combination system, or in part, as separate components, devices, and systems, as appropriate. Thus, each embodiment disclosed herein can be incorporated in each of the aspects to varying degrees as appropriate for a given implementation. Further, the various apparatus, optical elements, DACs, SubDACs, inductors, mixers, resistors, power supplies, differential signal lines, multiplexers, demultiplexers, electro-optical devices, inputs, outputs, ports, channels, components and parts of the foregoing disclosed herein can be used with any laser, laser-based communication system, waveguide, fiber, transmitter, transceiver, receiver, and other devices and systems without limitation.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

Where a range or list of values is provided, each intervening value between the upper and lower limits of that range or list of values is individually contemplated and is encompassed within the disclosure as if each value were specifically enumerated herein. In addition, smaller ranges between and including the upper and lower limits of a given range are contemplated and encompassed within the disclosure. The listing of exemplary values or ranges is not a disclaimer of other values or ranges between and including the upper and lower limits of a given range.

The use of headings and sections in the application is not meant to limit the disclosure; each section can apply to any aspect, embodiment, or feature of the disclosure. Only those claims which use the words "means for" are intended to be interpreted under 35 USC 112, sixth paragraph. Absent a recital of "means for" in the claims, such claims should not be construed under 35 USC 112. Limitations from the specification are not intended to be read into any claims, unless such limitations are expressly included in the claims.

Embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module," or

What is claimed is:

1. A system comprising:
   a phase detector comprising,
   a first inductor having an inductance $L_1$;
   a second inductor having an inductance $L_2$; and
   a frequency mixer having a parasitic capacitance $C_{Tail}$, the frequency mixer comprising,
   a common node tail,
   a first clock signal generator configured to output a first clock signal having a first frequency, and
   a second clock signal generator configured to output a second clock signal having a second frequency, the first clock signal generator and the second clock signal generator in electrical communication with the common node tail,
   a first resistor in electrical communication with the first clock signal generator,
   a second resistor in electrical communication with the second clock signal generator, and
   an output channel configured to transmit a DC voltage signal ($V_{phase}$) that corresponds to a phase relationship between the first clock signal and the second clock signal.

2. The system of claim 1, wherein the first inductor and the second inductor are in series.

3. The system of claim 1, wherein $L_1$ is proportional to $L_2$.

4. The system of claim 1, wherein the first clock signal generator is a first MOS transistor and the second clock signal generator is a second MOS transistor, each MOS transistor comprises a source, gate, and drain.

5. The system of claim 4, wherein a gate of the first MOS transistor is configured to receive the first clock signal.

6. The system of claim 4 wherein the first MOS transistor and the second MOS transistor are matched.

7. The system of claim 4 further comprising a positive power delivery node (OP) and a negative power deliver node (ON).

8. The system of claim 7, wherein the drain of the first MOS transistor is in electrical communication with the OP and the drain of the second MOS transistor is in electrical communication with the ON.

9. The system of claim 7 further comprising a bridge capacitor in electrical communication with and disposed between the OP and the ON.

10. The system of claim 7 wherein $V_{phase}$ is equal to a DC component of a difference between a voltage at the OP and a voltage at the ON.

11. The system of claim 1, wherein the second frequency is twice the first frequency.

12. The system of claim 1, wherein the first frequency and the second frequency each may range from about 10 GHz to about 500 GHz.

13. The system of claim 1 further comprising a capacitor, the capacitor in parallel with one of the first or second inductors.

14. The system of claim 1 further comprising a first DAC and a second DAC, each DAC in electrical communication with the output channel.

15. The system of claim 14, wherein the first DAC and the second DAC are configured to process input data in an interleaved manner that is delayed by a value corresponding to or proportional to $V_{phase}$.

16. A method of reducing parasitic capacitance in a phase detector, the method comprising
    providing a current source to a frequency mixer, wherein the current source comprises a first inductor in electrical communication and in series with a second inductor such that parasitic capacitance is reduced thereby;
    generating a first clock signal having a first frequency;
    generating a second clock signal having a second frequency, the first frequency equal to about 0.5 of the second frequency;
    mixing the first clock signal and the second clock signal using the frequency mixer while the frequency mixer is receiving current from the current source at a tail node; and
    generating an output signal $V_{phase}$, wherein $V_{phase}$ corresponds to a phase difference between the first clock signal and the second clock signal.

17. The method of claim 16 further comprising: varying a first resistance and a second resistance of the frequency mixer to change $V_{phase}$.

18. The method of claim 16 further comprising: selecting an inductance $L_1$ of the first inductor and an inductance $L_2$ of the second inductor such that the first inductor and the second inductor resonate.

19. The method of claim 18, wherein the inductance $L_1$ ranges from about 50 pH to about 3 nH, wherein the inductance $L_2$ is about 0.1 to about 5 times the inductance $L_1$.

20. The method of claim 18, wherein a combined impedance comprising the inductance $L_1$ and the inductance $L_2$ exhibits a local maximum at the first frequency and a local maximum at the second frequency.

* * * * *